United States Patent [19]

Miura et al.

[11] Patent Number: 5,083,180
[45] Date of Patent: Jan. 21, 1992

[54] LATERAL-TYPE SEMICONDUCTOR DEVICE

[75] Inventors: Masato Miura; Tatsuo Shimura, both of Hitachi; Tadaaki Kariya, Naka; Norihiro Kawauchi, Hitachi; Sinichi Kurita, Mito, all of Japan

[73] Assignees: Hitachi Ltd., Tokyo; Hitachi Haramachi Semiconductor, Hitachi, both of Japan

[21] Appl. No.: 595,580

[22] Filed: Oct. 11, 1990

[30] Foreign Application Priority Data

Oct. 18, 1989 [JP] Japan .................. 1-268959

[51] Int. Cl.⁵ .............................. H01L 29/72
[52] U.S. Cl. .............................. 357/43; 357/20; 357/48; 357/34; 357/50
[58] Field of Search .............. 357/35, 48, 20, 34, 357/43, 50

[56] References Cited

U.S. PATENT DOCUMENTS 4,633,291 12/1986 Koyama .................. 357/35 X
4,684,970 8/1987 Sloane et al. .................. 357/35

FOREIGN PATENT DOCUMENTS

59-127865 7/1984 Japan.

Primary Examiner—Rolf Hille
Assistant Examiner—Roy Potter
Attorney, Agent, or Firm—Antonelli, Terry Stout & Kraus

[57] ABSTRACT

A lateral-type semiconductor device is provided in which a p-emitter layer and a p-collector layer are formed on the exposed-surface side of an n-base layer. The exposed surfaces of the p-emitter layer and the n-base layer are substantially surrounded by the exposed surface of the p-collector layer. The n-base layer is connected to a base electrode or through a first heavily-doped region extending from under the n-base region to an exposed surface area on the outer-periphery side of the p-collector layer. In an alternative embodiment a second heavily-doped region for connecting the n-base layer and the first heavily-doped region can be provided.

13 Claims, 5 Drawing Sheets

LATERAL-TYPE SEMICONDUCTOR DEVICE

BACKGROUND OF THE INVENTION

The present invention relates to a lateral-type semiconductor device, and more particularly to a lateral, bipolar transistor.

In general, a bipolar linear IC includes npn transistors and pnp transistors in a state that the npn transistors are mixed with the pnp transistors, to increase the degree of freedom in circuit design and to simplify the circuit construction of the IC. Further, a vertical npn transistor and a lateral pnp transistor are widely used to form a bipolar linear IC. This is because not only the p-emitter region and p-collector region of the pnp transistor but also the p-base region of the npn transistor can be formed in an n-semiconductor substrate by a common process, and thus the number of fabrication steps of the IC can be reduced.

In a lateral pnp transistor, the breakdown voltage of the collector junction is obtained by spreading a depletion layer into a lightly-doped base (that is, a semiconductor foundation region). Thus, in order to prevent the depletion layer from reaching the emitter junction, that is, in order to prevent the generation of punch-through, the distance between an emitter and a collector (that is, the width of the base) is made greater than the width of depletion layer corresponding to the design breakdown-voltage of the collector junction. As a result, the current amplification factor and cut-off frequency of the lateral pnp transistor are inferior to those of a vertical transistor.

In order to solve the above problem of the lateral transistor, various element structures have been proposed.

For example, a pnp transistor is disclosed in a Japanese patent application JP-A-sho 59-127,865. This transistor includes an n-base region which is formed in a main surface of an n-foundation region and is higher in impurity concentration than the foundation region a p-emitter region formed in the n-base region, a first, p-collector region formed in the foundation region and spaced apart from the n-base region, and a second p-collector region which is extended from the first p-collector region to the n-base region so that the n-base region is surrounded by the second p-collector region. The second p-collector region is smaller in impurity concentration than the first p-collector region and the n-base region. According to the above structure, when a low collector voltage is applied, the second collector region acts as the collector of the transistor. When a high collector voltage is applied, a depletion layer spreads into the second collector region, and the first collector region acts as the collector of the transistor. Thus, the current amplification factor, the cut-off frequency and the breakdown voltage are all improved.

In the pnp transistor disclosed in the above-referred Japanese patent application JP-A-sho 59-127,865, a base electrode is not put in direct contact with the n-base region, but is kept in ohmic contact with the exposed surface of an n$^+$-region which is formed so that the foundation region is surrounded by the n$^+$-region. Hence, a base current flows between an emitter electrode and the base electrode through the following current path: emitter electrode→p-emitter region→n-base region→foundation region→n$^+$-region→base electrode. The base resistance of transistor is determined by the current paths of base current. In the pnp transistor disclosed in the above-referred Japanese patent application JP-A-sho 59-127,865, the current path of base current includes the highly-resistive foundation region. Hence, this pnp transistor is far greater in base resistance than a vertical npn transistor, in which a base current flows only in a base region having low resistance. In a case where the pnp transistor large in base resistance is used for forming a linear IC, there arise the following problems. ①  Variations in base-emitter voltage $V_{BE}$ based upon a manufacturing process are increased. ② When the npn transistor and the pnp transistor are both used for forming a circuit, the difference in $V_{BE}$ between the npn transistor and the pnp transistor and the difference in temperature characteristic between these transistors are increased. ③ Thermal noise due to the base resistance is increased, and readily fluctuates. That is, the characteristics of the linear IC are adversely affected by the large base resistance of the pnp transistor used.

SUMMARY OF THE INVENTION

It is an object of the present invention to provide a lateral transistor which is small in base resistance. In more detail, the above object of the present invention is to provide a lateral transistor which is able to have small base resistance, without reducing the efficiency of area utilization.

It is another object of the present invention to provide a lateral transistor which is suited to be used in an integrated circuit.

In order to attain the above objects, according to the present invention, there is provided a lateral transistor in which a base current flows between an emitter electrode and a base electrode without passing through a foundation region, and in which a base region is substantially surrounded, in a main surface of the lateral transistor, by a collector region. In order to cause the base current to flow through a current path which does not include the foundation region, it is desirable from the practical point of view to connect the base region and a position where the base electrode is formed, by a low-resistance region which is smaller in resistivity than the foundation region. A heavily-doped semiconductor region, a metal silicide region, and a buried metal region having a high melting point can be used as the above low-resistance region. The expression that the base region is substantially surrounded by the collector region, shows that the collector region is not required to have the form with a closed loop but may have the form of an open loop provided with a gap. It is important in the present invention that the base electrode is not surrounded by the collector region but is provided on the outer-periphery side of the collector region. In a case where a transistor according to the present invention is included in an integrated circuit (specifically, a linear IC) it is desirable to use the above transistor as the transistor connected to the input side of an amplifier circuit.

According to the present invention, the base region is substantially surrounded by the collector region, the base electrode is provided on the outer-periphery side of the collector region, and the base electrode is connected to the base region which exists on the inner-periphery side of the collector region, through the low-resistance region which is small in resistivity than the foundation region. Accordingly, the base current flows through a current path which does not include the foundation region. Thus, the base resistance can be made small. Further, the whole of the inner periphery of the collector region confronts the whole of the outer periphery of the base region. Thus, the current value per unit area is increased, and the efficiency of area utilization can be enhanced.

DESCRIPTION OF THE PREFERRED EMBODIMENTS

Now, embodiments of a semiconductor device according to the present invention will be explained below in detail, with reference to the drawings.

Figure 1A:
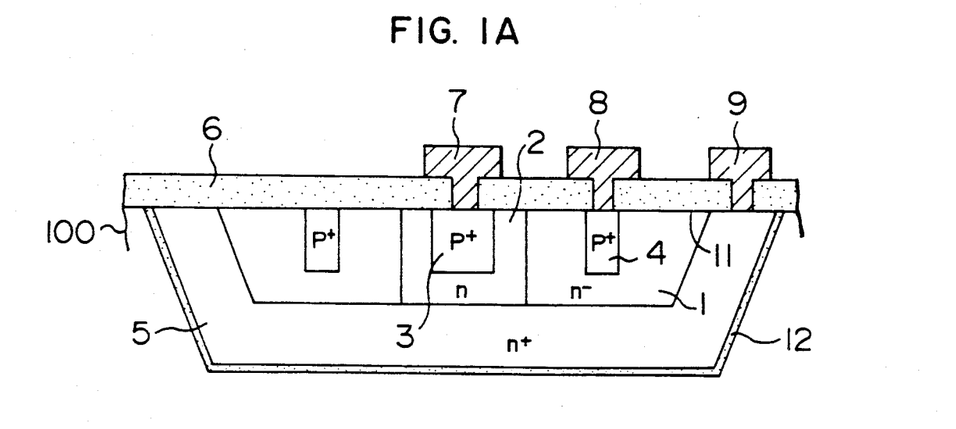
FIGS. 1A and 1B are sectional and plan views showing an embodiment of a semiconductor device according to the present invention.
Figure 1B:
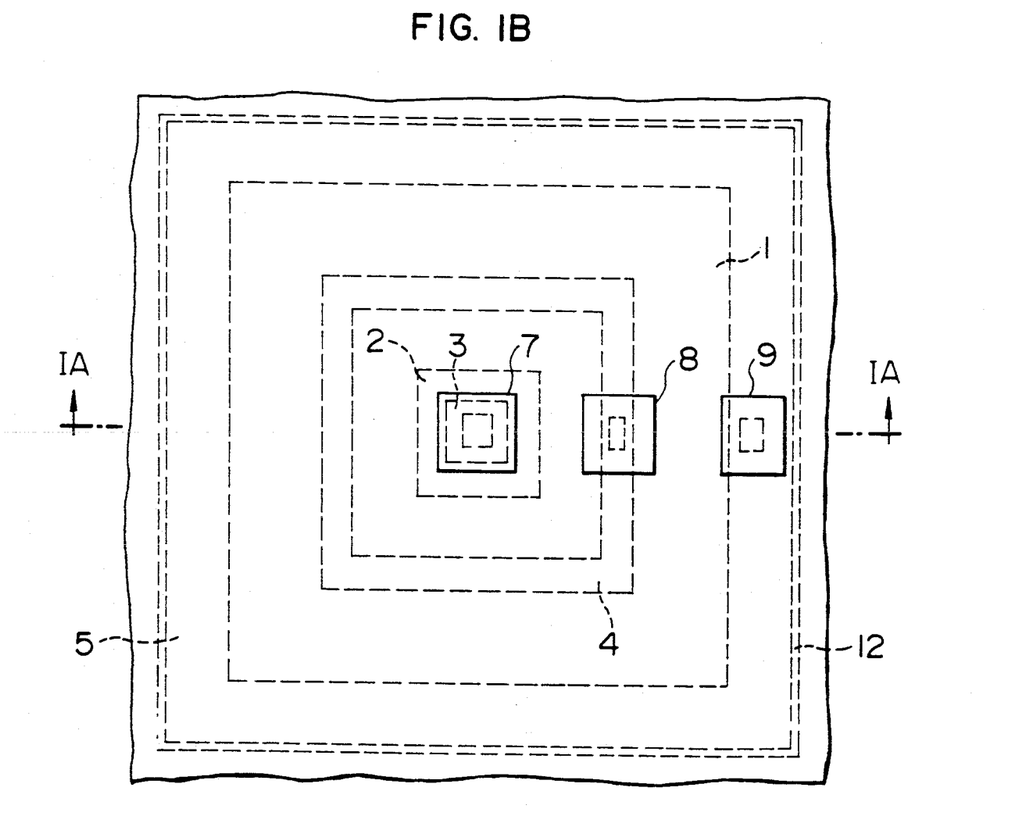

FIGS. 1A and 1B show an embodiment of a semiconductor device according to the present invention. In more detail, FIG. 1B is a plan view showing the present embodiment, and FIG. 1A is a sectional view taken along the line 1a—1a of FIG. 1B. In FIGS. 1A and 1B, reference numeral 1 designates an n-type semiconductor foundation region, 2 an n-base region which extends from a portion of a main surface 11 of the foundation region 1 toward the inside thereof and is higher in impurity concentration than the foundation region 1, 3 a p-emitter region which extends from the exposed surface of the base region 2 toward the inside thereof and is higher in impurity concentration than the base region 2, 4 a p-collector region which extends from the main surface 11 of the foundation region 1 toward the inside thereof, is made in the form of a loop so that in the main surface 11, the base region 2 is surrounded by the collector region 4 with a predetermined distance therebetween, and is higher in impurity concentration than the foundation region, and 5 an n-buried region which is formed along other faces of the foundation region 1 than the main surface 11, is kept in contact with the bottom of the base region, and is higher in impurity concentration than the foundation region 1. The structure made up of the buried region 5 and the foundation region 1 surrounded by the buried region 5 corresponds to one of island regions which are juxtaposed in one main surface of a large semiconductor substrate 100 in such a manner that the island regions are electrically isolated from each other. The electric separation due to a pn junction or a dielectric is used to isolate the island regions from each other. In FIGS. 1A and 1B, an island region is covered by an SiO$_2$ film 12, that is, the dielectric separation is used to isolate the island region electrically from other island regions. Further, in FIGS. 1A and 1B, reference numeral 6 designates an oxide film formed on the exposed surface of each of the regions 1 to 5, 7 an emitter electrode kept in ohmic contact of the exposed surface of the emitter region 3, 8 a collector electrode kept in ohmic contact with the exposed surface of the collector region 4, and 9 a base electrode kept in ohmic contact with the exposed surface of the buried layer 5.

According to a lateral transistor having the above-mentioned structure, the base region 2 is surrounded by the collector region 4. Accordingly, the whole periphery of the base resion can contribute to a current flowing through the transistor. Thus, a desired current can be obtained by a transistor having a small area, and the collector resistance can be made small. Further, the base region 2 is connected to the base electrode 9 by the heavily-doped, buried region 5. Thus, the base current is prevented from flowing through the high-resistance foundation region 1. That is, the base resistance of the lateral transistor is small.

A pnp transistor according to the present embodiment is shown in FIGS. 1A and 1B, by way of example. It is needless to say that an npn transistor which is obtained by replacing the n and p in FIG. 1A with each other, can produce the same effect as in the pnp transistor of FIGS. 1A and 1B. Although each of the emitter region, base region and collector region shown in FIG. 1B has the form of a square loop, these regions may be made in the form of concentric circles.

Figure 2:
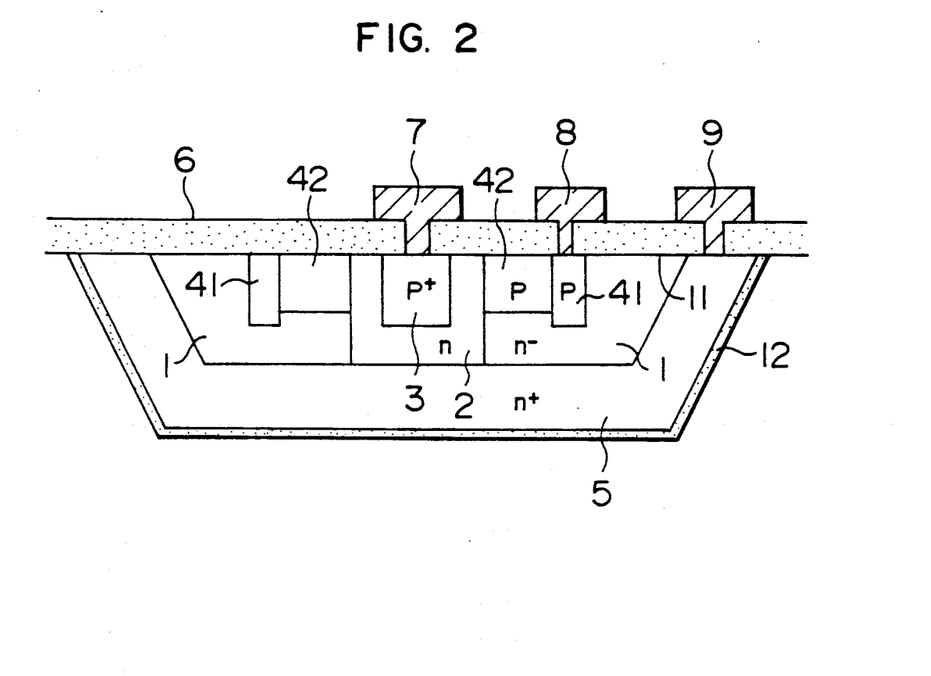
FIGS. 2 and 3 are sectional views showing another and a further embodiments of a semiconductor device according to the present invention.

FIGS. 2 shows another embodiment of a semiconductor device according to the present invention. This embodiment is different in the structure of collector region from the embodiment of FIGS. 1A and 1B. As shown in FIG. 2, the collector region of the present embodiment is made up of a first collector region 41 and a second collector region 42. The first collector region 41 is formed in such a manner that the base region 2 is surrounded by the first collector region 41 with a predetermined distance therebetween. The second collector region 42 extends from the first collector region 41 to the base region 2, is smaller in the depth from the main surface 11 than the first collector region 41, is larger in impurity concentration than the foundation region 1, and is smaller in impurity concentration than the base region 2 and the first collector region 41.

In a lateral transistor having the above structure, the second collector region 42 acts as the collector of the transistor when a low collector voltage is applied. Thus, this transistor is superior in current amplification factor and cut-off frequency to the transistor of FIGS. 1A and 1B, and moreover the area occupied by the transistor can be made small. When a high collector voltage is applied, a depletion layer extends into the second collector region 42. Thus, the lateral transistor having the structure of FIG. 2 is able to have a high breakdown voltage.

Although a pnp transistor is shown in FIG. 2, an npn transistor having the structure similar to that shown in FIG. 2 can be made. Further, the emitter region 3, the base region 2, the second collector region 42 and the first collector region 41 may have the form of concentric circles at the main surface 11.

Figure 3:
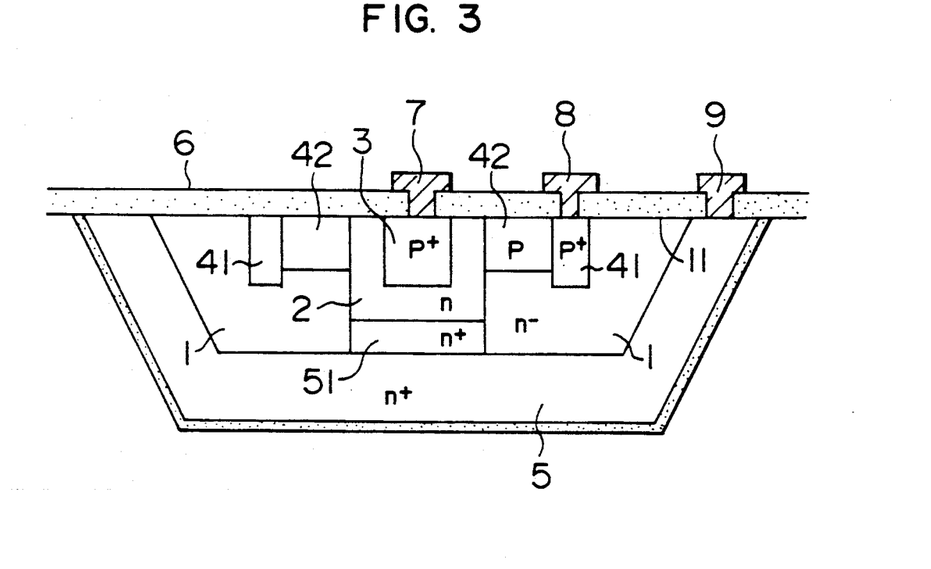

FIG. 3 shows a further embodiment of a semi-conductor device according to the present invention. The present embodiment is different from the embodiment of FIG. 2 in that the base region 2 is connected to the buried region 5 through an n-connecting region 51. In the embodiment of FIG. 2, the base region 2, the emitter region 3, the first collector region 41 and the second collector region 42 are formed by the diffusion method or ion implantation method. In this case, the depth of the base region 2 is limited. In a transistor having a high breakdown voltage, a depletion layer having large width is formed when a large reverse bias voltage is applied across the collector junction. According to the structure of FIG. 2, the width of depletion layer is small, and thus it is impossible to obtain a high breakdown voltage.

In the embodiment of FIG. 3, the connecting region 51 is previously formed to increase the width of depletion. Thus, the embodiment of FIG. 3 is higher in breakdown voltage than the embodiment of FIG. 2.

Now, numerical values used in the embodiment of FIG. 3 will be mentioned below, by way of example. The foundation region 1 has a resistivity of 20 $\Omega$cm, the base region 2 has a sheet resistivity of 40 $\Omega/\square$ and a diffusion depth of 5 $\mu$m, the emitter region 3 has a sheet resistivity of 10 $\Omega/\square$ and a diffusion depth of 3 $\mu$m, the buried region 5 has a sheet resistivity of 40 $\Omega/\square$, the connecting region 51 has a resistivity of 1 $\Omega$cm, the distance between the base region 2 and the buried region 5 in a vertical direction is 25 $\mu$m, and the area of the emitter region 3 at the main surface 11 is 400 $\mu$m$^2$. In a case where the connecting region 51 is absent, the base resistance will be 7 to 8 K$\Omega$. When the connecting region 51 is formed, the base resistance is 500 $\Omega$. That is, the presence of the connecting region 51 can reduce the base resistance by more than one order of magnitude. Further, the thermal noise due to the base resistance is generally proportional to the base resistance value. Thus, the presence of the connecting region 51 can reduce the thermal noise by more than one order of magnitude.

An npn transistor having the structure similar to that of the pnp transistor of FIG. 3 can be made. Further, the emitter region 3, the base region 2, the first collector region 41 and the second collector region 42 may have the form of concentric circles at the main surface 11.

FIGS. 4A to 4D are sectional views for explaining a method of fabricating the embodiment of FIG. 3.

Figure 4A:
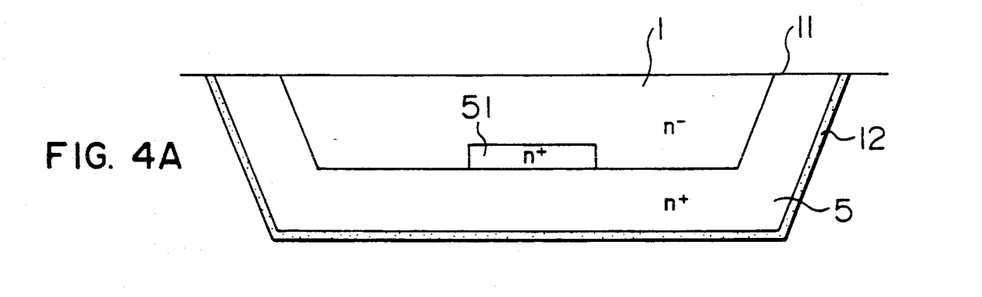
FIGS. 4A to 4D are sectional views for explaining a method of fabricating the embodiment of FIG. 3.

In order to fabricate the embodiment of FIG. 3, a dielectric separated substrate is prepared which has the island region shown in FIG. 4A. The island region is made up of the n-foundation region 1 and the n-buried region 5 which is formed along the SiO$_2$ film 12 between the foundation region 1 and the SiO$_2$ film 12, has the protrusion 51 on the foundation-region side, and is higher in impurity concentration than the foundation region 1.

Figure 4B:
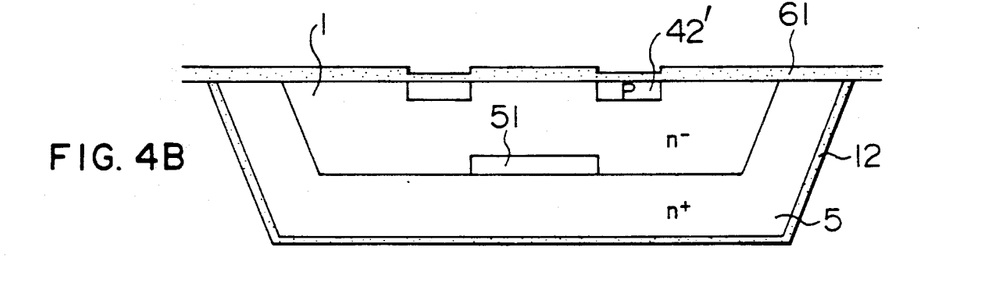

Next, the ion implantation using boron ions is carried out for a selected surface area of the foundation region 1, to form a thin, p-region 42' as shown in FIG. 4B. In FIG. 4B, reference numeral 61 designates an SiO$_2$ film which was used when the ion implantation was carried out.

Figure 4C:
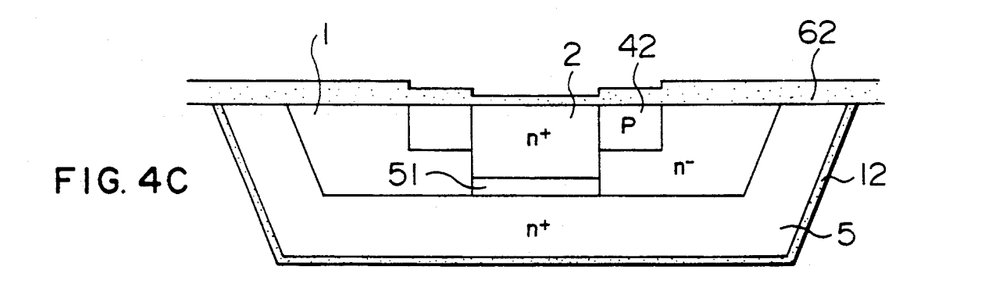

Then, an aperture is provided in the SiO$_2$ film 61. A diffusion process for diffusing phosphorus into the foundation region 1 to the depth reaching the buried region 5 is carried out while using the above SiO$_2$ film as a mask, to form the base region 2 (FIG. 4C). In this diffusion process, the region 42' is expanded, and thus the second collector region 42 is formed. Reference numeral 62 in FIG. 4C designates an SiO$_2$ film which is obtained at a time the diffusion process has been completed.

Figure 4D:
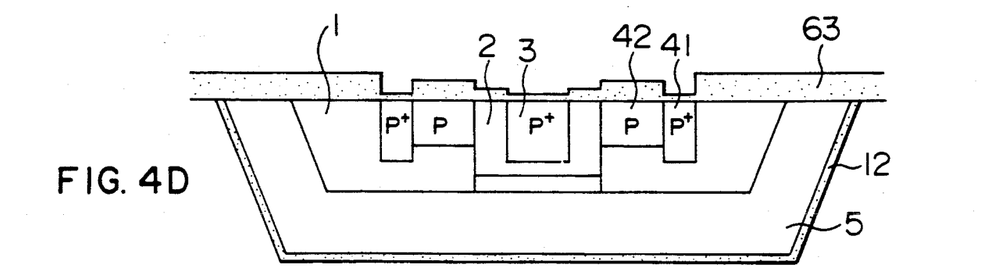

Next, apertures are selectively provided in the SiO$_2$ film 62. A diffusion process for diffusing boron into the foundation region 1 and the base region 2 is carried out while using the above SiO$_2$ film as a mask, to form the first collector region 41 and the emitter region 3 (FIG. 4D). Reference numeral 63 in FIG. 4D designates an SiO$_2$ film which is obtained at a time the above diffusion process has been completed. Thereafter, apertures are provided in the SiO$_2$ film 63, to form electrodes, thereby completing the transistor.

In this fabricating method, when the aperture of the SiO$_2$ film 61 for forming the base region 2 is made similar in shape to the aperture of the SiO$_2$ film 62 for forming the emitter region 3, the base width is made uniform at the whole periphery of the emitter region 3, and thus current concentration can be prevented.

When the protrusion 51 is eliminated from FIG. 4A, FIGS. 4A to 4D can show a method of fabricating the embodiment of FIG. 2. Further, when the protrusion 51 and the thin region 42'0 are eliminated from FIGS. 4A and 4B, respectively, FIGS. 4a to 4D can show the embodiment of FIG. 1.

Figure 5A:
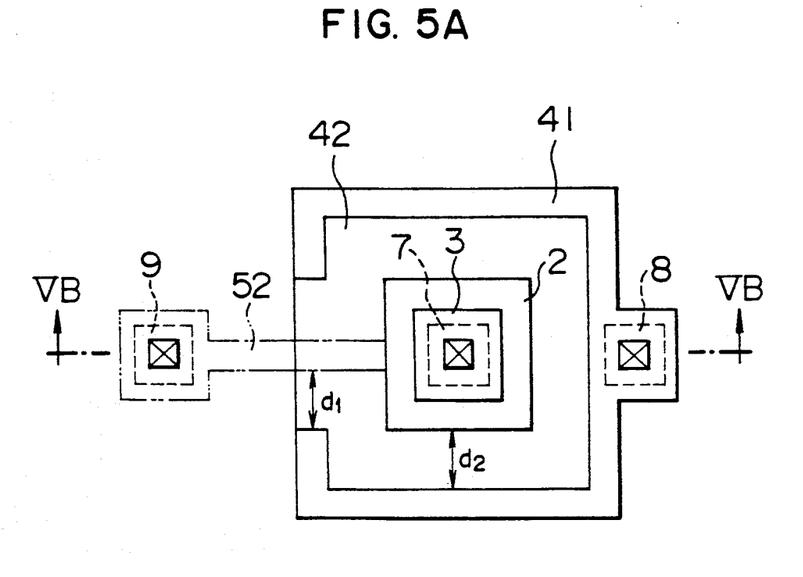
FIGS. 5A and 5B are plan and sectional views showing still another embodiment of a semiconductor device according to the present invention.
Figure 5B:
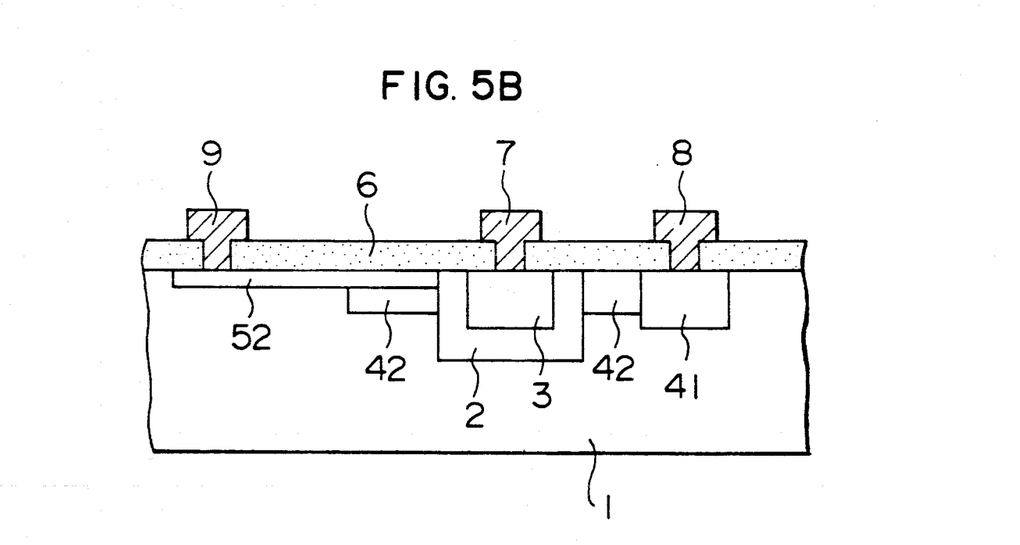

FIGS. 5A and 5B shows still another embodiment of a semiconductor device according to the present invention. In more detail, FIG. 5A is a plan view showing the present embodiment, and FIG. 5B is a sectional view taken along the line 5b—5b of FIG. 5A. The present embodiment is different from the embodiment of FIG. 2 in that the first collector region 41 has the form of an open loop provided with a gap, and an n-connecting region 52 which is formed between the base region 2 and the base electrode 9, is exposed to the main surface. The connecting region 52 is made smaller in depth than the second collector region 42, and extends from the base region 2 to the outer-periphery side of the first collector region 41 through the gap portion thereof. In this case, when the connecting region 52 is substantially equal in impurity concentration to the base region 2, the distance $d_1$ between the connecting region 52 and one end of the gap portion of the first collector region 41 is made equal to the width $d_2$ of the second collector region 42. Usually, the impurity concentration of the connecting region 52 is made higher than that of the base region 52 is made higher than that of the base region 2. When the connecting region 52 is higher in impurity concentration than the base region 2, the distance $d_1$ is made larger than the width $d_2$. The present embodiment is formed in an electrically-isolated island region, though the island region is not shown in FIGS. 5A and 5B. An npn transistor having the structure similar to that of the pnp transistor of FIGS. 5A and 5B can be made. Further, the emitter region 3, the base region 2, the second collector region 42 and the first collector region 41 which are shown in FIG. 5A, may have the form of concentric circles.

Figure 6:
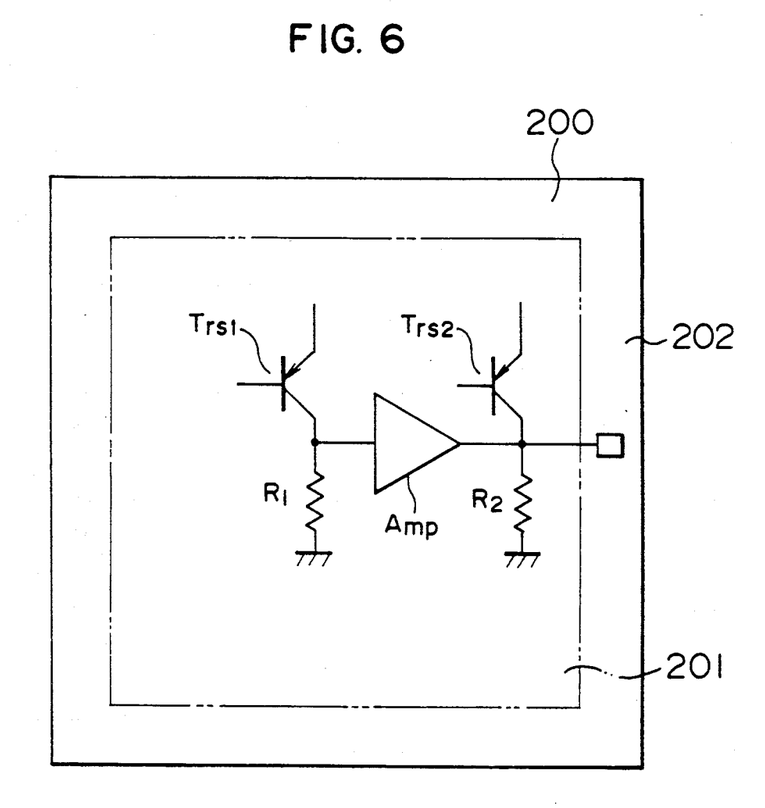
FIG. 6 is a schematic, plan view showing a linear IC which includes a semiconductor device according to the present invention.

FIG. 6 shows still a further embodiment of a semiconductor device according to the present invention, in which embodiment one of the above-mentioned transistors is included in a linear IC. In FIG. 6, reference numeral 200 designates an IC chip, 201 an element forming area of the IC chip, and 202 a bonding-pad forming area of the IC chip. Referring to FIG. 6, a first bipolar transistor Tr$_{S1}$ and a first resistor R$_1$ are connected to the input side of an amplifier (Amp) which is widely used in a linear IC, and a second bipolar transistor Tr$_{S2}$ and a second resistor R$_2$ are connected to the output side of the amplifier (Amp). In a case where a transistor according to the present invention is used in the above circuit, when the inventive transistor is used as the input transistor Tr$_{S1}$, the noise of the input transistor is reduced, and thus the noise in the output of the circuit can be reduced. In such a case, it is preferable that the output transistor Tr$_{S2}$ also is a transistor according to the present invention.

As has been explained in the foregoing, according to the present invention, there is provided a lateral transistor which has small base resistance and is excellent in efficiency of area utilization.

We claim:

1. A semiconductor device comprising:

a first semiconductor region of one conductivity tape;

a second semiconductor region of the one conductivity type extending from a main surface of the first semiconductor region toward the inside thereof, the second semiconductor region being higher in impurity concentration than the first semiconductor region;

a third semiconductor region of the other conductivity type extending from the exposed surface of the second semiconductor region toward the inside thereof, the third semiconductor region being higher in impurity concentration than the second semiconductor region;

a fourth semiconductor region of the other conductivity type extending from the main surface of the first semiconductor region toward the inside thereof so that the exposed surface of the second semiconductor region is substantially surrounded by the exposed surface of the fourth semiconductor region, the fourth semiconductor region being higher in impurity concentration than the first semiconductor region;

a fifth semiconductor region of the one conductivity type contiguous to the first semiconductor region, a buried portion of the fifth semiconductor region being connected directly with a bottom portion of the second semiconductor region, an upper portion of the fifth semiconductor region being exposed to the main surface of the first semiconductor region on the outer-periphery side of the fourth semiconductor region, the fifth semiconductor region being higher in impurity concentration than the first semiconductor region;

a first electrode kept in ohmic contact with the exposed surface of the third semiconductor region;

a second electrode kept in ohmic contact with the exposed surface of the fourth semiconductor region; and a third electrode kept in ohmic contact with the exposed surface of the fifth semiconductor region.

2. A semiconductor device comprising:

a first semiconductor region of one conductivity type;

a second semiconductor region of the one conductivity type extending from a main surface of the first semiconductor region toward the inside thereof, the second semiconductor region being higher in impurity concentration than the first semiconductor region;

a third semiconductor region of the other conductivity type extending from the exposed surface of the second semiconductor region toward the inside thereof, the third semiconductor region being higher in impurity concentration than the second semiconductor region;

a fourth semiconductor region of the other conductivity type extending from the main surface of the first semiconductor region toward the inside thereof so that the exposed surface of the second semiconductor region is substantially surrounded by the exposed surface of the fourth semiconductor region, the fourth semiconductor region being higher in impurity concentration than the first semiconductor region;

a fifth semiconductor region of the other conductivity type formed between the second semiconductor region and the fourth semiconductor region so that the fifth semiconductor region is put in contact with each of the second and fourth semiconductor regions, and extending from the main surface of the first semiconductor region toward the inside thereof, the fifth semiconductor region being higher in impurity concentration than the first semiconductor region and lower in impurity concentration than the fourth semiconductor region;

a sixth semiconductor region of the one conductivity type contiguous to the first semiconductor region, a buried portion of the sixth semiconductor region being connected directly with a bottom portion of the second semiconductor region, an upper portion of the sixth semiconductor region being exposed to the main surface of the first semiconductor region on the outer-periphery side of the fourth semiconductor region, the sixth semiconductor region being higher in impurity concentration than the first semiconductor region;

a first electrode kept in ohmic contact with the exposed surface of the third semiconductor region;

a second electrode kept in ohmic contact with the exposed surface of the fourth semiconductor region; and a third electrode kept in ohmic contact with the exposed surface of the sixth semiconductor region.

3. A semiconductor device according to claim 2, wherein the first semiconductor region is formed in one of a plurality of island regions which are juxtaposed in one main surface of a semiconductor substrate and which are electrically isolated from each other.

4. A semiconductor device comprising:

a first semiconductor region of one conductivity type;

a second semiconductor region of the one conductivity type extending from a main surface of the first semiconductor region toward the inside thereof, the second semiconductor region being higher in impurity concentration than the first semiconductor region;

a third semiconductor region of the other conductivity type extending from the exposed surface of the second semiconductor region toward the inside thereof, the third semiconductor region being higher in impurity concentration than the second semiconductor region;

a fourth semiconductor region of the other conductivity type extending from the main surface of the first semiconductor region toward the inside thereof so that the exposed surface of the second semiconductor region is substantially surrounded by the exposed surface of the fourth semiconductor region, the fourth semiconductor region being higher in impurity concentration than the first semiconductor region;

a fifth semiconductor region of the other conductivity type formed between the second semiconductor region and the fourth semiconductor region so that the fifth semiconductor region is put in contact with each of the second and fourth semiconductor regions, and extending from the main surface of the first semiconductor region toward the inside thereof, the fifth semiconductor region being higher in impurity concentration than the first semiconductor region and lower in impurity concentration than the fourth semiconductor region;

a sixth semiconductor region of the one conductivity type contiguous to the first semiconductor region, a buried portion of the sixth semiconductor region extending under a bottom portion of the second semiconductor region, an upper portion of the sixth semiconductor region being exposed to the main surface of the first semiconductor region on the outer-periphery side of the fourth semiconductor region, the sixth semiconductor region being higher in impurity concentration than the first semiconductor region;

a seventh semiconductor region of the one conductivity type for connecting the bottom portion of the second semiconductor region and the buried portion of the sixth semiconductor region, the seventh semiconductor region being higher in impurity concentration than the first semiconductor region;

a first electrode kept in ohmic contact with the exposed surface of the third semiconductor region;

a second electrode kept in ohmic contact with the exposed surface of the fourth semiconductor region; and a third electrode kept in ohmic contact with the exposed surface of the sixth semiconductor region.

5. A semiconductor device according to claim 4, wherein the first semiconductor region is formed in one of a plurality of island regions which are juxtaposed in one main surface of a semiconductor substrate and which are electrically isolated from each other.

6. A semiconductor device comprising:
a first semiconductor region of one conductivity type;
a second semiconductor region of the one conductivity type extending from a main surface of the first semiconductor region toward the inside thereof, the second semiconductor region being higher in impurity concentration than the first semiconductor region;
a third semiconductor region of the other conductivity type extending from the exposed surface of the second semiconductor region toward the inside thereof, the third semiconductor region being higher in impurity concentration than the second semiconductor region;
a fourth semiconductor region of the other conductivity type extending from the main surface of the first semiconductor region toward the inside thereof so that the exposed surface of the fourth semiconductor region has the form of an open loop provided with a gap and the exposed surface of the second semiconductor region is substantially surrounded by the exposed surface of the fourth semiconductor region, the fourth semiconductor region being higher in impurity concentration than the first semiconductor region;
a fifth semiconductor region of the other conductivity type formed between the second semiconductor region and the fourth semiconductor region so that the fifth semiconductor region is put in contact with each of the second and fourth semiconductor regions, and extending from the main surface of the first semiconductor region toward the inside thereof, the fifth semiconductor region being higher in impurity concentration than the first semiconductor region and lower in impurity concentration than the fourth semiconductor region;
a sixth semiconductor region of the one conductivity type extending from the exposed surfaces of the first and fifth semiconductor regions toward the inside of each of the first and fifth semiconductor regions, wherein one end portion of the sixth semiconductor region is connected to the second semiconductor region, and wherein the sixth semiconductor region extends along the exposed surfaces of the first and fifth semiconductor regions from the second semiconductor region to the outer-periphery side of the fourth semiconductor region through the gap portion of the fourth semiconductor region so that the other end portion of the sixth semiconductor region is on the outer-periphery side of the fourth semiconductor region, the sixth semiconductor region being higher in impurity concentration than the first and the fifth semiconductor regions;
a first electrode kept in ohmic contact with the exposed surface of the third semiconductor region;
a second electrode kept in ohmic contact with the exposed surface of the fourth semiconductor region; and
a third electrode kept in ohmic contact with the exposed surface of the sixth semiconductor region on the outer-periphery side of the fourth semiconductor region.

7. A semiconductor device according to claim 6, wherein the exposed surface of the fourth semiconductor region is substantially equally spaced apart from the exposed surface of the second semiconductor region at an area where the exposed surfaces of the fourth and second semiconductor regions face each other.

8. A semiconductor device according to one of claim 6, wherein the distance between the exposed surface of the sixth semiconductor region and the exposed surface of the fourth semiconductor region is equal to or greater than the distance between the exposed surface of the second semiconductor region and the exposed surface of the fourth semiconductor region.

9. A semiconductor device according to claim 6, wherein a thickness of the fifth semiconductor region in a direction from the exposed surface of the fifth semiconductor region toward the inside thereof is smaller than the corresponding thickness of the fourth semiconductor region.

10. A semiconductor device according to claim 6, wherein the thickness of the sixth semiconductor region in a direction from the exposed surface of the sixth semiconductor region toward the inside thereof is smaller than the corresponding thickness of the fifth semiconductor region.

11. A semiconductor device according to claim 6, wherein the first semiconductor region is formed in one of a plurality of island regions which are juxtaposed in one main surface of a semiconductor substrate and are electrically isolated from each other.

12. A semiconductor device comprising:
a semiconductor region of one conductivity type;
a second semiconductor region of the one conductivity type extending from a main surface of the first semiconductor region toward the inside thereof, the second semiconductor region being higher in impurity concentration than the first semiconductor region;

an emitter region of the other conductivity type extending from the exposed surface of the second semiconductor region toward the inside thereof for defining a base region between the first semiconductor region and the emitter region, the emitter region being higher in impurity concentration than the second semiconductor region;

a first collector region of the other conductivity type extending from the main surface of the first semiconductor region toward the inside thereof so that the exposed surface of the second semiconductor region is substantially surrounded by the exposed surface of the first collector region with a predetermine distance therebetween the first collector region being higher in impurity concentration than the first semiconductor region;

a second collector region of the other conductivity type formed between the second semiconductor region and the first collector region so that the second collector region is put in contact with each of the second semiconductor region and the first collector region, and extending from the main surface of the first semiconductor region toward the inside thereof, the second collector region being higher in impurity concentration than the first semiconductor region and lower in impurity concentration than the first collector region;

an emitter electrode kept in ohmic contact with the exposed surface of the emitter region;

a collector electrode kept in ohmic contact with the exposed surface of the first collector region;

a base electrode formed on the main surface of the first semiconductor region on the outer-periphery side of the first collector region; and means for allowing a base current to flow between the emitter electrode and the base electrode without passing through the first semiconductor region.

13. A semiconductor device including a plurality of bipolar transistors and at least one amplifier circuit, the bipolar transistors and the amplifier circuit being formed on a semiconductor substrate, at least one of the bipolar transistors being connected to the input side of the amplifier circuit, said one bipolar transistor comprising:

a first semiconductor region of one conductivity type;

a second semiconductor region of the one conductivity type extending from a main surface of the first semiconductor region toward the inside thereof, the second semiconductor region being higher in impurity concentration than the first semiconductor region;

an emitter region of the other conductivity type extending from the exposed surface of the second semiconductor region toward the inside thereof for defining a base region between the first semiconductor region and the emitter region, the emitter region being higher in impurity concentration than the second semiconductor region;

a first collector region of the other conductivity type extending from the main surface of the first semiconductor region toward the inside thereof so that the exposed surface of the second semiconductor region is substantially surrounded by the exposed surface of the first collector region with a predetermined distance therebetween, the first collector region being higher in impurity concentration than the first semiconductor region;

a second collector region of the other conductivity type formed between the second semiconductor region and the first collector region so that the second collector region is put in contact with each of the second semiconductor region and the first collector region, and extending from the main surface of the first semiconductor region toward the inside thereof, the second collector region being higher in impurity concentration than the first semiconductor region and lower in impurity concentration than the first collector region;

an emitter electrode kept in ohmic contact with the exposed surface of the emitter region;

a collector electrode kept in ohmic contact with the exposed surface of the first collector region;

a base electrode formed on the main surface of the first semiconductor region on the outer-periphery side of the first collector region; and means for allowing a base current to flow between the emitter electrode and the base electrode without passing through the first semiconductor region.

* * * * *